United States Patent
Ma et al.

(10) Patent No.: US 11,437,281 B2
(45) Date of Patent: Sep. 6, 2022

(54) METHOD FOR MANUFACTURING SEMICONDUCTOR DEVICE AND SEMICONDUCTOR DEVICE THEREBY FORMED

(71) Applicant: Nexchip Semiconductor Co., LTD, Anhui (CN)

(72) Inventors: Zhongxiang Ma, Anhui (CN); Ching-Ming Lee, Anhui (CN); Po-Hua Kung, Anhui (CN)

(73) Assignee: Nexchip Semiconductor Co., LTD, Hefei (CN)

( * ) Notice: Subject to any disclaimer, the term of this patent is extended or adjusted under 35 U.S.C. 154(b) by 22 days.

(21) Appl. No.: 16/851,067

(22) Filed: Apr. 16, 2020

(65) Prior Publication Data
US 2021/0193529 A1    Jun. 24, 2021

(51) Int. Cl.
H01L 21/8234 (2006.01)
H01L 27/088 (2006.01)
H01L 29/06 (2006.01)
H01L 29/423 (2006.01)

(52) U.S. Cl.
CPC ........... H01L 21/823462 (2013.01); H01L 21/823481 (2013.01); H01L 27/088 (2013.01); H01L 29/0649 (2013.01); H01L 29/42364 (2013.01)

(58) Field of Classification Search
CPC ......... H01L 21/823462; H01L 29/0649; H01L 27/088; H01L 29/42364; H01L 21/823481; H01L 21/28229; H01L 27/0886; H01L 29/513; H01L 29/66795; H01L 21/0206; H01L 21/82343; H01L 21/823493; H01L 21/823418; H01L 29/063; H01L 29/7823; H01L 29/7825; H01L 29/0653; H01L 21/76224; H01L 21/02164; H01L 21/0217; H01L 21/31111; H01L 21/28035; H01L 29/66704; H01L 29/4236; H01L 29/402; H01L 29/7816; H01L 21/308; H01L 29/66681; H01L 29/66893; H01L 29/517; H01L 29/66772; H01L 29/6653; H01L 29/66628; H01L 29/165
USPC ........ 438/275, 981, 270; 257/368, 296, 337, 257/339, 330, 347, E29.02, E21.625, 257/E21.628
See application file for complete search history.

(56) References Cited

U.S. PATENT DOCUMENTS

| | | | |
|---|---|---|---|
| 10,985,071 B1 * | 4/2021 | Yang | H01L 21/823857 |
| 2003/0067050 A1 * | 4/2003 | Kim | H01L 21/823462 257/501 |

(Continued)

*Primary Examiner* — Mouloucoulaye Inoussa

(57) ABSTRACT

The present disclosure provides a method for manufacturing semiconductor device and a semiconductor device formed using same. The method includes: preparing a substrate; forming a pad oxide layer and a barrier layer on the substrate, the barrier layer is disposed on the pad oxide layer; forming a plurality of shallow trench isolation structures in the substrate to form multiple regions in the substrate; removing a part of the barrier layer to form a recess, the recess is set in any one of the multiple regions, and a region directly below the recess is defined as a high voltage device region; and forming a gate oxide layer in the recess, and removing the barrier layer. The method provided in the present disclosure simplifies the manufacturing process and reduces the production costs.

5 Claims, 5 Drawing Sheets

(56) References Cited

U.S. PATENT DOCUMENTS

| | | | | |
|---|---|---|---|---|
| 2005/0059215 A1* | 3/2005 | Kim | ............... | H01L 21/823481 |
| | | | | 438/275 |
| 2011/0133276 A1* | 6/2011 | Thei | ............... | H01L 21/823481 |
| | | | | 257/337 |
| 2014/0117444 A1* | 5/2014 | Liu | .................. | H01L 21/26513 |
| | | | | 257/337 |

* cited by examiner

METHOD FOR MANUFACTURING SEMICONDUCTOR DEVICE AND SEMICONDUCTOR DEVICE THEREBY FORMED

CROSS REFERENCES TO RELATED APPLICATIONS

This application claims the benefit of priority to Chinese Patent Application No. CN 2019113265639, filed with CNIPO on Dec. 20, 2019, the contents of which are incorporated herein by reference in its entirety.

TECHNICAL FIELD

The present disclosure relates to the technical field of semiconductor, and in particular, to a method for manufacturing semiconductor device and a semiconductor device formed using same.

BACKGROUND

High voltage metal oxide semiconductor (HVMOS) components are widely applied in many electronic components, such as power supplies of micro central processing unit (CPU), power management systems and AC/DC converters.

HVMOS components need to keep a high voltage. Therefore, a gate dielectric layer of the HVMOS component also needs to withstand a gate-to-drain high voltage. Generally, the gate dielectric layer of the HVMOS component is a thick oxide layer, and is thicker than the gate oxide layer of the gate dielectric layer of a low voltage metal oxide semiconductor component serving as a core component. The low voltage metal oxide semiconductor component may be formed on the same wafer as the high voltage metal oxide semiconductor component. In the well-known methods for forming the high voltage metal oxide semiconductor components and the low voltage metal oxide semiconductor components, a recess will be formed in a shallow trench isolation structure in a substrate, which seriously affects performance of the device.

SUMMARY

The present disclosure provides a method for manufacturing semiconductor device and a semiconductor device formed using same, to improve the semiconductor manufacturing process, and avoid forming recesses in a shallow trench isolation structure.

The present disclosure provides a method for manufacturing semiconductor device, comprising: preparing a substrate; forming a pad oxide layer and a barrier layer on the substrate, the barrier layer is disposed on the pad oxide layer; forming a plurality of shallow trench isolation structures in the substrate to form multiple regions in the substrate; removing a part of the barrier layer to form a recess, the recess is set in any one of the multiple regions, and a region directly below the recess is defined as a high voltage device region; and forming a gate oxide layer in the recess, and removing the barrier layer, where a thickness of the gate oxide layer is greater than a thickness of the pad oxide layer.

Further, the recess exposes the pad oxide layer, and the gate oxide layer contacts the pad oxide layer.

Further, the recess exposes the substrate, and the gate oxide layer contacts the substrate.

Further, the gate oxide layer is disposed on the high voltage device region.

Further, a region adjacent to the high voltage device region in the plurality of regions is defined as a low voltage device region.

Further, the low voltage device region is isolated from the high voltage device region through the shallow trench isolation structure.

Further, the shallow trench isolation structure runs through the barrier layer and the pad oxide layer and extends into the substrate.

Further, the present disclosure provides a semiconductor device, comprising: a substrate; a pad oxide layer, disposed on the substrate; a plurality of shallow trench isolation structures, formed in the substrate and dividing the substrate into multiple regions; and a gate oxide layer, disposed on the pad oxide layer, where a thickness of the gate oxide layer is greater than a thickness of the pad oxide layer, and the gate oxide layer is formed by: forming a barrier layer on the pad oxide layer; removing a part of the barrier layer to form a recess, where the recess is set in any one of the multiple regions, and a region directly below the recess is defined as a high voltage device region; and forming a gate oxide layer in the recess, and removing the barrier layer.

Further, the recess exposes the pad oxide layer, and the gate oxide layer contacts the pad oxide layer.

Further, the recess exposes the substrate, and the gate oxide layer contacts the substrate.

Further, the semiconductor device comprises a memory.

In summary, the present disclosure provides a method for manufacturing semiconductor device and a semiconductor device formed using same. After a shallow trench isolation structure is formed, the barrier layer is used again to form a recess on the barrier layer. A part of the substrate directly below the recess is defined as a high voltage device region, and then a gate barrier layer is formed in the recess, and the barrier layer is removed. By repeatedly using the barrier layer, the method in the present application is simple in manufacturing processes, and can effectively avoid f recess in the shallow trench isolation structure. Moreover, this method is easy to control the thickness of the gate oxide layer.

DETAILED DESCRIPTION OF THE PREFERRED EMBODIMENTS

Figure 1:
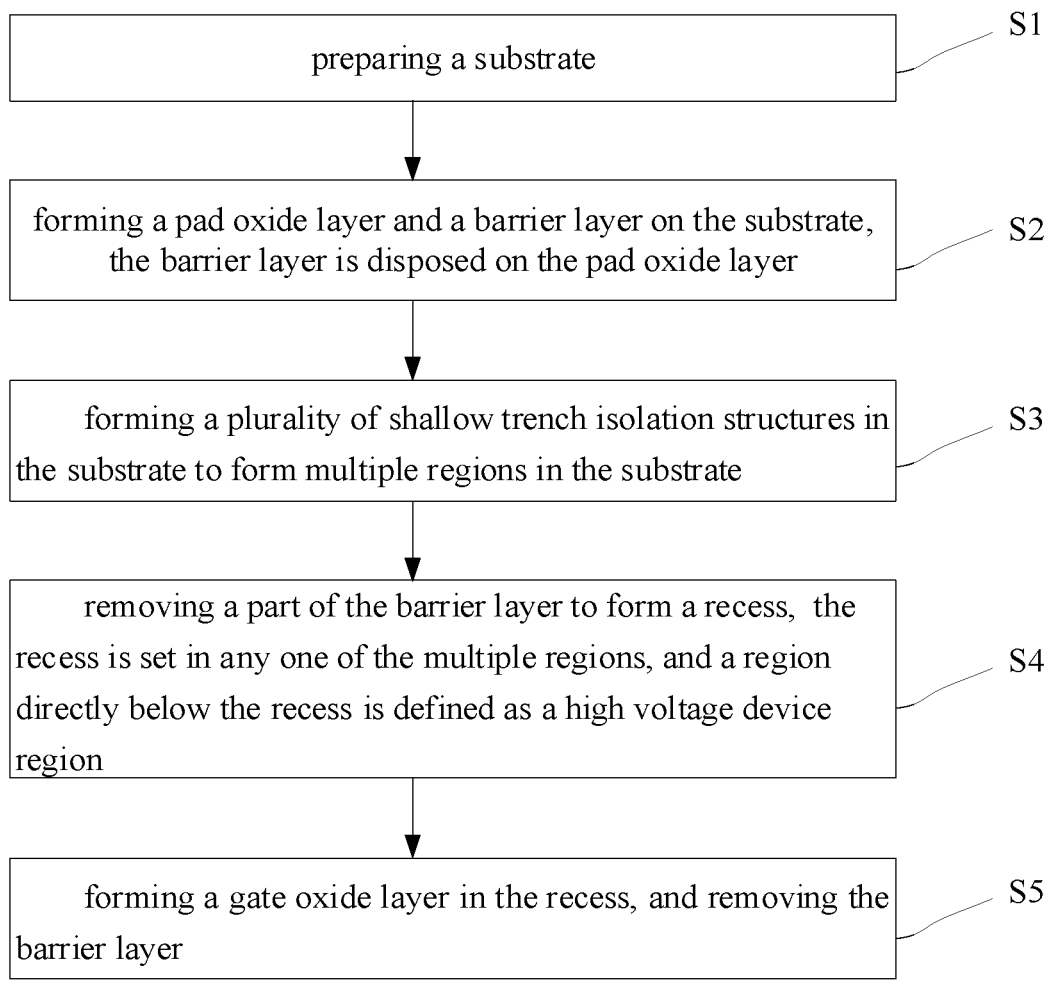
FIG. 1 is a flowchart of a method for manufacturing semiconductor device according to an embodiment.

The following describes the embodiments of the present disclosure through specific examples. A person skilled in the art can easily understand other advantages and effects of the present disclosure from the content disclosed in this specification. The present disclosure may also be implemented or applied through different specific embodiments. Various details in this specification may also be modified or changed based on different viewpoints and applications without departing from the spirit of the present disclosure.

It should be noted that the drawings provided in the following embodiments only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

As shown in FIG. 1, the present disclosure provides a method for manufacturing semiconductor device, comprising:

S1: preparing a substrate;

S2: forming a pad oxide layer and a barrier layer on the substrate, the barrier layer is disposed on the pad oxide layer;

S3: forming a plurality of shallow trench isolation structures in the substrate to form a plurality of regions in the substrate;

S4: removing part of the barrier layer to form a recess, the recess is set in any one of the plurality of regions, and a region directly below the recess is defined as a high voltage device region; and S5: forming a gate oxide layer in the recess, and removing the barrier layer.

Figure 2:
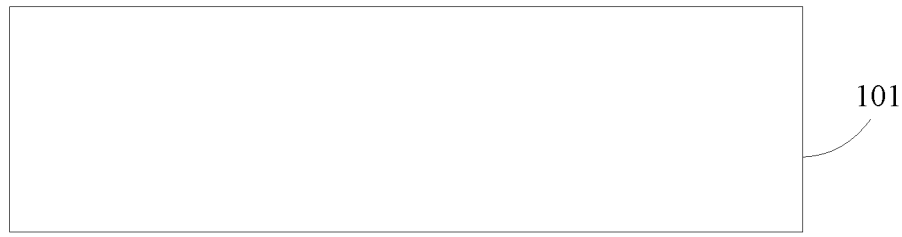
FIG. 2 is a schematic diagram of operation S1.

As shown in FIG. 2, in operation S1, a substrate 101 is prepared first. The material of the substrate 101 may include but is not limited to a monocrystalline or polycrystalline semiconductor material. Specifically, the substrate 101 may include an intrinsic monocrystalline silicon substrate or a doped silicon substrate. The substrate 101 includes a substrate of a first doping type, and the first doping type may be a P type or an N type. In this embodiment, a P type is taken as an example of the first doping type. That is, in this embodiment, the substrate 101 is a P-type substrate, such as a P-type silicon substrate.

In some embodiments, the substrate 101 may also be a monocrystalline silicon substrate, a Ge substrate, a SiGe substrate, a silicon on insulation (SOI), or any combination thereof. According to the requirement of the device, the substrate 101 may be made of any appropriate semiconductor material, which is not limited herein.

In some embodiments, the substrate 101 may also be made of a compound semiconductor material. The compound semiconductor material is, for example, a III-V semiconductor material or a II-VI semiconductor material.

Figure 3:
FIG. 3 is a schematic diagram of operation S2.

As shown in FIG. 3, in operation S2, a pad oxide layer 102 is formed on the substrate 101, and then a barrier layer 103 is formed on the pad oxide layer 102. The pad oxide layer 102 is configured to reduce the stress between the substrate 101 and the barrier layer 103. The material of the pad oxide layer 102 may be, for example, silicon oxide or silicon oxynitride. The pad oxide layer 102 made of a silicon oxide material may be formed by means of, for example, furnace oxidation, rapid thermal annealing oxidation, in-situ water vapor oxidation, or other thermal oxidation methods. Silicon oxynitride may be formed by performing a nitriding process on silicon oxide. The nitriding process may be high-temperature furnace nitriding, rapid thermal annealing nitriding, plasma nitriding, or other nitriding processes. The barrier layer 103 is disposed on the pad oxide layer 102. The barrier layer 103 protects the active region in the subsequent etching process. In this embodiment, the material of the barrier layer 103 may be, for example, silicon nitride. The barrier layer 103 may be formed through a technology such as a chemical vapor deposition. The chemical vapor deposition technology includes a low-pressure chemical vapor deposition method or a plasma enhanced chemical vapor deposition method.

Figure 4:
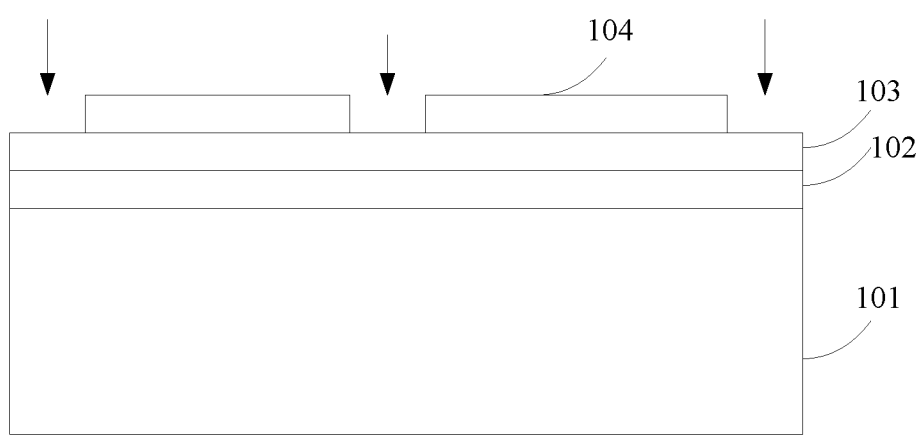
FIGS. 4 to 6 are schematic diagrams of operation S3.

As shown in FIG. 4, in operation S3, after the pad oxide layer 102 and the barrier layer 103 are formed, a patterned photoresist layer 104 is formed on the barrier layer 103. The patterned photoresist layer 104 exposes a part of the barrier layer 103, and the patterned photoresist layer 104 defines the position of the shallow trench isolation structure. In this embodiment, the etching may be performed by reactive ion etching or plasma etching. That is, the barrier layer 103 and the pad oxide layer 102 are sequentially etched through a reactive ion etching process or a plasma etching process to expose the surface material of the substrate 101. Then the substrate 101 is etched with a fluorine-inclusive etching gas by using the barrier layer 103 and the pad oxide layer 102 as masks, so as to form the trench 105. The arrow in FIG. 3 indicates the direction of the etching.

In some embodiments, for example, a photoresist layer may be formed on the barrier layer 103 by using a spin coating method. After the exposure and development processes, an opening is formed on the photoresist layer. By using the patterned photoresist layer as a mask, the barrier layer 103 and the pad oxide layer 102 under the opening are removed until the substrate 101 is exposed. The photoresist layer is removed by ashing, and then, by using the barrier layer 103 and the pad oxide layer 102 as masks, the semiconductor substrate 101 is etched through dry etching to form the trench 105.

Figure 5:
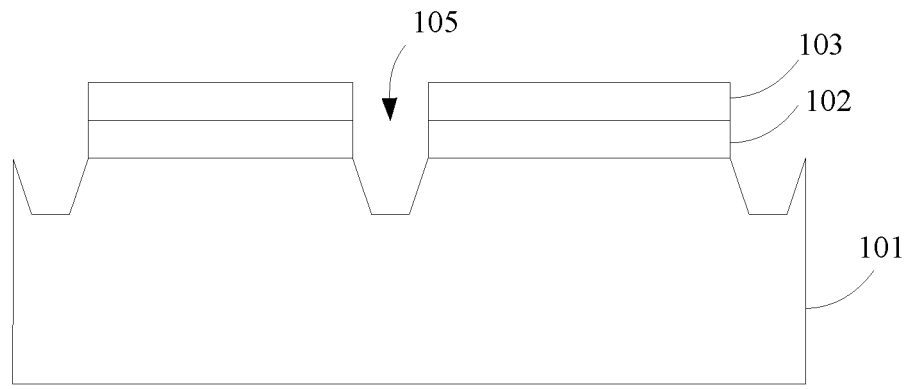

As shown in FIG. 5, in operation S3, the trench 105 runs through the pad oxide layer 102 and the barrier layer 103, and extends to the semiconductor substrate 101. That is, the trench 105 may include, for example, a first part and a second part. The first part is disposed between the barrier layer 103 and the pad oxide layer 102, the second part is disposed in the substrate 101, and the second part is trapezoidal. In this embodiment, a shallow trench isolation structure is formed in the trench 105 region, and the substrate 101 covered by the barrier layer 103 and the pad oxide layer 102 serves as an active region to form a semiconductor device. In some embodiments, the shape of a longitudinal section of the trench 105 may be set according to actual needs, and the shape of the longitudinal section of the trench 105 may be U-shaped.

Figure 6:
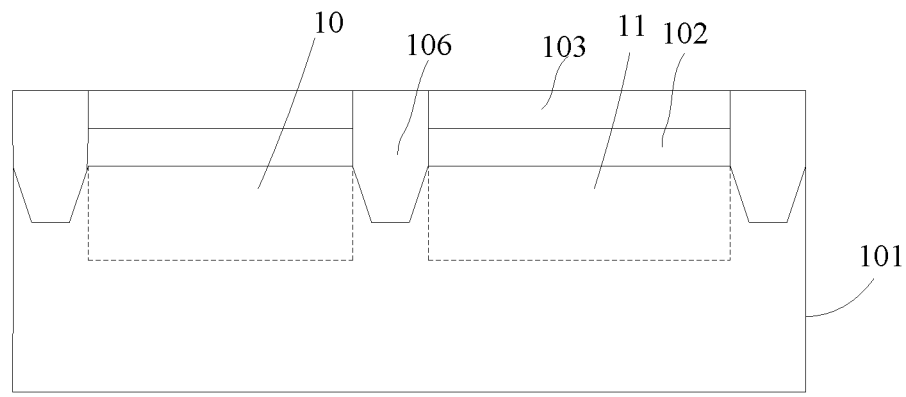

As shown in FIG. 6, in operation S3, first, an oxide layer is formed on the bottom and sidewall of the trench 105 and on the barrier layer 103 by means of chemical vapor deposition, and then chemical mechanical polishing is performed to cause an top surface of the buffer material in the trench 105 to be leveled with the top surface of the barrier layer 103, so as to form a shallow trench isolation structure 106. In this embodiment, the material of the oxide layer may be, for example, silicon oxide or silicon oxynitride. The width of the shallow trench isolation structure 106 may be set according to design requirements of the semiconductor structure.

In some embodiments, a lining oxide layer may be formed on the sidewall and the bottom of the trench 105, and then by means of high-density plasma chemical vapor deposition, an insulation material such as silicon oxide, silicon nitride, or silicon oxynitride may be formed on the lining oxide layer and the barrier layer 103 to fill the trench 105. After that, the insulation material is polished by means of chemical mechanical polishing to form the shallow trench isolation structure 106.

As shown in FIG. 6, in this embodiment, a plurality of shallow trench isolation structures 106 are formed in the substrate 101. The plurality of shallow trench isolation structures 106 divide the substrate 101 into a plurality of regions, and the plurality of regions are distributed in parallel, and have spacing therein, or the regions are arbitrarily distributed according to the semiconductor structure. In this embodiment, the plurality of shallow trench isolation structures 106 divide the substrate 101 into two regions, that is, the first region 10 and the second region 11. The first region 10 and the second region 11 are separated by the shallow trench isolation structure 106. The first region 10 and the second region 11 are used for fabricating a high voltage device region or a low voltage device region.

Figure 7:
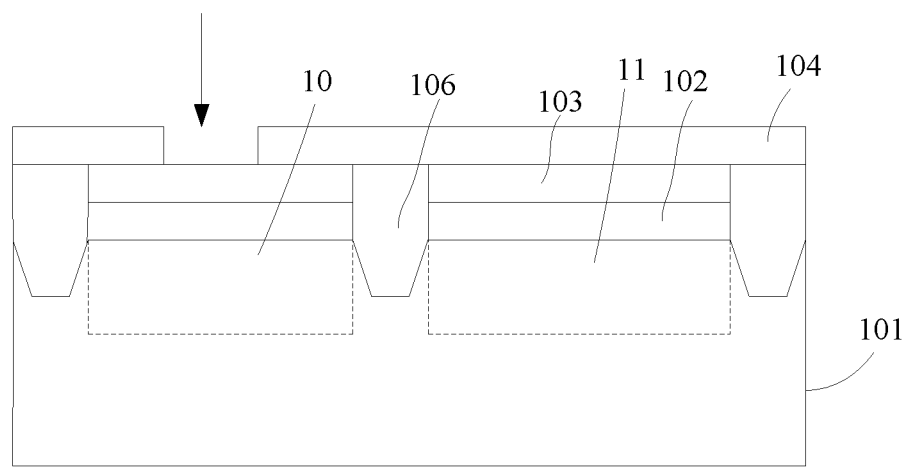
FIGS. 7 to 8 are schematic diagrams of operation S4.
Figure 8:
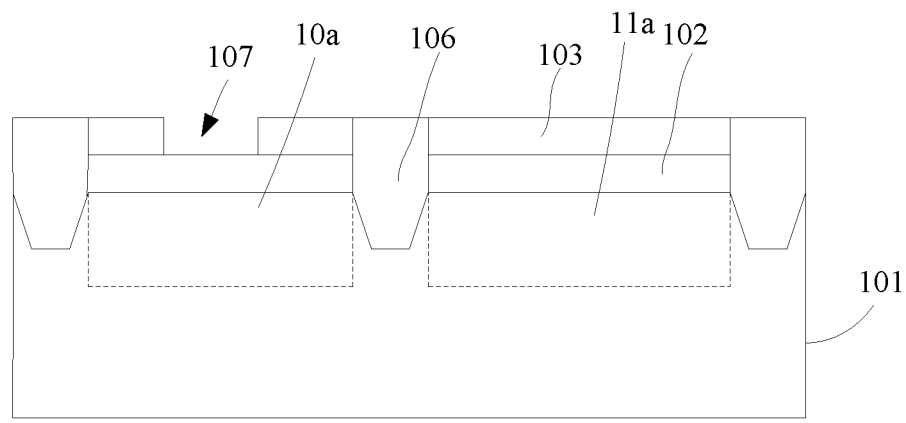

As shown in FIG. 7 and FIG. 8, in operation S4, a patterned photoresist layer 104 is formed on the barrier layer 103. The patterned photoresist layer 104 has an opening, and the opening is disposed between two adjacent shallow trench isolation structures 106. Specifically, the opening is disposed in the first region 10, and the opening exposes a part of the barrier layer 103. Then the barrier layer 103 is etched according to the opening to form a recess 107. The recess 107 exposes the pad oxide layer 102, and the recess 107 is used to form a gate oxide layer. The arrow direction in FIG. 7 indicates the etching direction. In this embodiment, the recess 107 is disposed in the first region 10. Therefore, the first region 10 directly below the recess 107 is defined as a high voltage device region 10a, and the second region 11 is defined as a low voltage device region 11a. The low voltage device region 11a is separated from the high voltage device region 10a by the shallow trench isolation structure 106. In this embodiment, a part of the barrier layer 103 may be removed in a way such as wet etching. The width of the recess 107 may be set according to design requirements of the semiconductor structure.

In some embodiments, the recess 107 may be set in the second region 11. Therefore, the second region 11 is defined as a high voltage device region, and the first region 10 is defined as a low voltage device region.

Figure 8A:
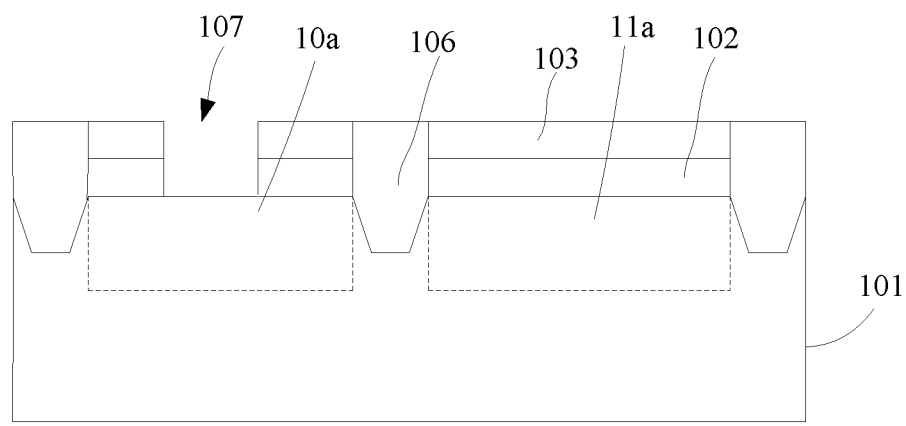
FIG. 8A is a schematic diagram of a recess according to another embodiment.

As shown in FIG. 8A, in some embodiments, at the time of forming the recess 107, a part of the barrier layer 103 and a part of the pad oxide layer 102 may be removed by etching, for example. The recess 107 exposes the substrate 101, and then a gate oxide layer is formed in the recess 107.

Figure 9:
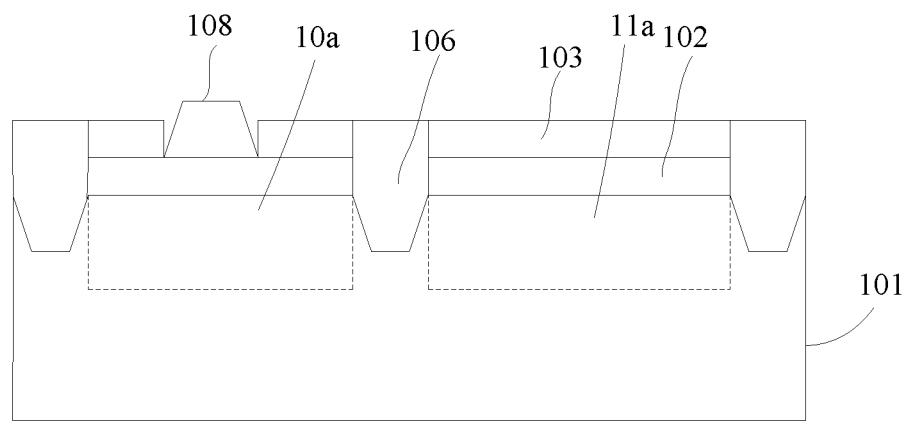
FIGS. 9 to 10 are schematic diagrams of operation S5.

As shown in FIG. 9, in operation S5, after the recess 107 is formed, the recess 107 defines the position of the gate oxide layer 108. In this embodiment, the gate oxide layer 108 may be formed in the recess 107 by a local silicon oxide process, for example. The gate oxide layer 108 is disposed in the high voltage device region 10. The thickness of the gate oxide layer 108 is greater than the thickness of the pad oxide layer 102, the voltage withstood by the high voltage device region 10a is greater than the voltage withstood by the low voltage device region 11a. In this embodiment, the thickness of the gate oxide layer 108 and the thickness of the pad oxide layer 102 may be set according to design requirements of the semiconductor structure. In this embodiment, the gate oxide layer 108 is an inverse trapezoid. The gate oxide layer 108 may also be another shape such as a rectangle or quasi-rectangle. The thickness of the gate oxide layer 108 may be, for example, several hundred to 1,000 angstroms. The material of the gate oxide layer 108 may be, for example, silicon oxide or silicon oxynitride.

Figure 10:
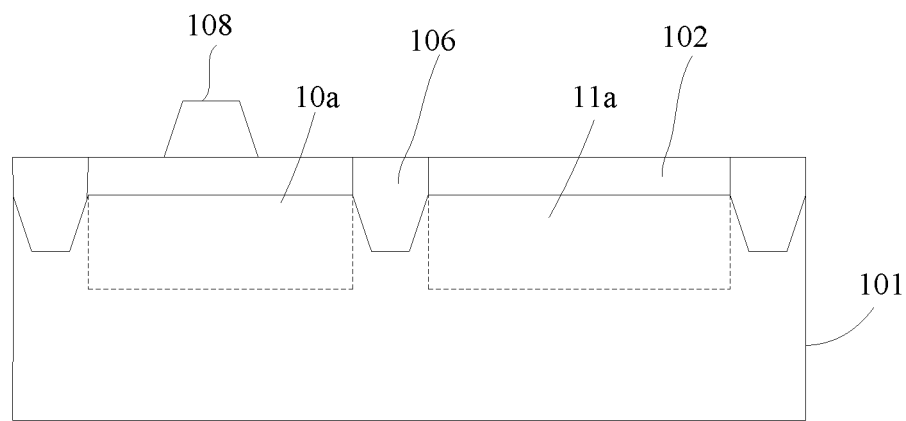

As shown in FIG. 10, in operation S5, after the gate oxide layer 108 is formed, the barrier layer 103 is removed by etching. As an example in this embodiment, the barrier layer 103 may be removed by wet etching. For example, the barrier layer 103 may be removed by using phosphoric acid and hydrofluoric acid to expose the pad oxide layer 102.

In some embodiments, after the gate oxide layer 108 is formed, a gate sidewall may be formed on both sides of the gate oxide layer 108 to protect the gate oxide layer 108.

The semiconductor device manufacturing method in the present disclosure is applicable to various memories, such as a non-volatile memory, a programmable read-only memory, an erasable programmable read-only memory, or a flash memory.

As shown in FIG. 9, this embodiment discloses a semiconductor device. The semiconductor device includes a substrate 101, a pad oxide layer 102 disposed on the substrate 101, and a barrier layer 103 disposed on the pad oxide layer 102. The barrier layer 103 includes a recess, a plurality of shallow trench isolation structures 106 formed in the substrate 101, and a gate oxide layer 108 disposed in the recess. The plurality of shallow trench isolation structures 106 divide the substrate 101 into multiple regions, and the gate oxide layer 108 contacts the pad oxide layer 102.

As shown in FIG. 9, in this embodiment, the material of the substrate 101 may include but is not limited to a monocrystalline or polycrystalline silicon semiconductor material. The substrate 101 may include an intrinsic monocrystalline silicon substrate or a doped silicon substrate. The substrate 101 includes a substrate of a first doping type, and the first doping type may be a P type or an N type. In this embodiment, the first doping type is a P type. That is, in this embodiment, the substrate 101 is a P-type substrate, such as a P-type silicon substrate.

In some embodiments, the substrate 101 may be a monocrystalline silicon substrate, a Ge substrate, a SiGe substrate, a silicon on insulation (SOI), or any combination thereof. As specific requirement of the device, an appropriate semiconductor material may be used as the substrate 101, which is not limited herein. In some embodiments, the substrate 101 may include a compound semiconductor material. The compound semiconductor material is, for example, a III-V semiconductor material or a II-VI semiconductor material.

As shown in FIG. 9, in this embodiment, the pad oxide layer 102 is disposed on the substrate 101. The pad oxide layer 102 reduces the stress between the substrate 101 and the barrier layer 103. The material of the pad oxide layer 102 may be, for example, silicon oxide or silicon oxynitride. For example, the pad oxide layer 102 made of a silicon oxide material may be formed by means of furnace oxidation, rapid thermal annealing oxidation, in-situ water vapor oxidation, or other thermal oxidation methods. Silicon oxynitride may be formed by performing a nitriding process on silicon oxide. The nitriding process may be high-temperature furnace nitriding, rapid thermal annealing nitriding, plasma nitriding, or other nitriding processes. The barrier layer 103 is disposed on the pad oxide layer 102. The barrier layer 103 protects the active region in a subsequent etching process. In this embodiment, the material of the barrier layer 103 may be, for example, silicon nitride. The barrier layer 103 may be formed through chemical vapor deposition technology. The chemical vapor deposition technology includes low-pressure chemical vapor deposition or plasma enhanced chemical vapor deposition. The barrier layer 103 contains a recess, and the recess exposes the pad oxide layer 102. The width of the recess depends on process design of the semiconductor structure.

As shown in FIG. 9, in this embodiment, the substrate 101 comprises a plurality of shallow trench isolation structures 106. The shallow trench isolation structures 106 run through the barrier layer 103 and the pad oxide layer 102, and extend into the substrate 101. The plurality of shallow trench isolation structures 106 divide the substrate 101 into multiple regions. The region directly below the recess is defined as a high voltage device region 10a, and the region adjacent to the high voltage device region 10a is defined as a low voltage device region 11a. In this embodiment, the gate oxide layer 108 is disposed in the recess, and the gate oxide layer 108 contacts the pad oxide layer 102. The thickness of the gate oxide layer 108 is greater than the thickness of the pad oxide layer 102, and the thickness of the gate oxide layer 108 may be, for example, several hundred to 1000 angstroms.

In some embodiments, gate sidewalls, for example, may be further disposed on both sides of the gate oxide layer 108 to protect the gate oxide layer 108.

As shown in FIG. 10, this embodiment provides a semiconductor device. The semiconductor device includes a substrate 101, a pad oxide layer 102 disposed on the substrate 101, a plurality of shallow trench isolation structures 106 formed in the substrate 101, and a gate oxide layer 108 disposed on the pad oxide layer 102.

As shown in FIG. 10, in this embodiment, the material of the substrate 101 may include but is not limited to a monocrystalline or polycrystalline silicon semiconductor material. The substrate 101 may include an intrinsic monocrystalline silicon substrate or a doped silicon substrate. The substrate 101 may be a substrate of a first doping type, and the first doping type may be a P type or an N type. In this embodiment, the first doping type is a P type. That is, in this embodiment, the substrate 101 is a P-type substrate, such as a P-type silicon substrate.

In some embodiments, the substrate 101 may be a monocrystalline silicon substrate, a Ge substrate, a SiGe substrate, a silicon on insulation (SOI), or any combination thereof. As specific requirement of the device, an appropriate semiconductor material may be used as the substrate 101, which is not limited herein. In some embodiments, the substrate 101 may include a compound semiconductor material. The compound semiconductor material is, for example, a III-V semiconductor material or a II-VI semiconductor material.

As shown in FIG. 10, the pad oxide layer 102 is disposed on the substrate 101, and the material of the pad oxide layer 102 may be, for example, silicon oxide or silicon oxynitride. The pad oxide layer 102 made of a silicon oxide material may be formed by means of furnace oxidation, rapid thermal annealing oxidation, in-situ water vapor oxidation, or other thermal oxidation methods. Silicon oxynitride may be formed by performing a nitriding process on silicon oxide. The nitriding process may be high-temperature furnace nitriding, rapid thermal annealing nitriding, plasma nitriding, or other nitriding processes.

As shown in FIG. 10, in this embodiment, the substrate 101 comprises a plurality of shallow trench isolation structures 106. The shallow trench isolation structures 106 run through the pad oxide layer 102, and extend into the substrate 101. The plurality of shallow trench isolation structures 106 divide the substrate 101 into multiple regions. In this embodiment, the gate oxide layer 108 is disposed on the pad oxide layer 102, the region directly below the gate oxide layer 108 is defined as a high voltage device region 10a, the region adjacent to the high voltage device region 10a is defined as a low voltage device region 11a, and the high voltage device region 10a is separated from the low voltage device region 11a by the shallow trench isolation structure 106. The material of the gate oxide layer 108 may be, for example, silicon oxide. The thickness of the gate oxide layer 108 is greater than the thickness of the pad oxide layer 102, and the thickness of the gate oxide layer 108 is, for example, several hundred to 1000 angstroms. A barrier layer is formed on the pad oxide layer 102 when forming the gate oxide layer 108, and then the barrier layer is etched to form a recess. The recess exposes the pad oxide layer 102, then the gate oxide layer 108 is formed in the recess through deposition, and then the barrier layer is removed. In this embodiment, the barrier layer may be, for example, a silicon nitride layer.

Figure 11:
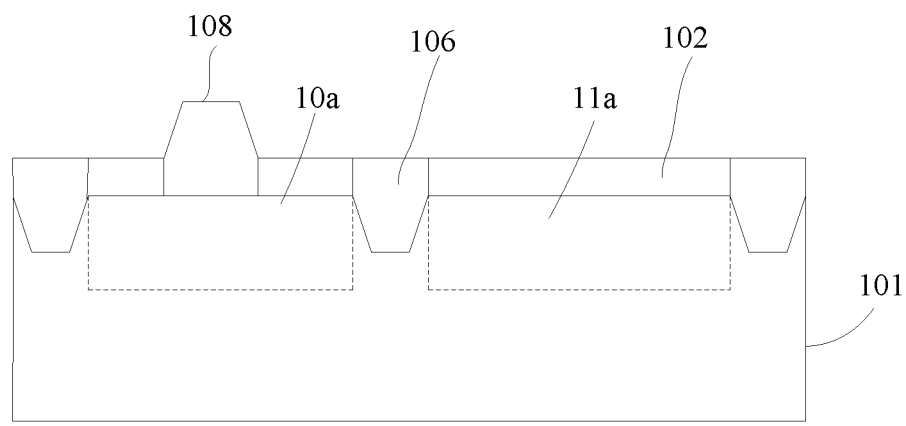
FIG. 11 is a schematic diagram of a semiconductor device according to an embodiment.

As shown in FIG. 11, this embodiment provides a semiconductor device. The semiconductor device comprises a substrate 101, a pad oxide layer 102 disposed on the substrate 101, a plurality of shallow trench isolation structures 106 formed in the substrate 101, and a gate oxide layer 108 disposed on the substrate 101.

As shown in FIG. 11, the plurality of shallow trench isolation structures 106 divide the substrate into a high voltage device region 10a and a low voltage device region 11a. The gate oxide layer 108 is disposed in the high voltage device region 10a, and the thickness of the gate oxide layer 108 is greater than the thickness of the pad oxide layer 102. The thickness of the gate oxide layer 108 is, for example, several hundred to 1000 angstroms. The gate oxide layer 108 is disposed between the pad oxide layers 102, and the gate oxide layer 108 directly contacts the substrate 101. The gate oxide layer 108 also contacts the pad oxide layer 102. In some embodiments, a part of the gate oxide layer 108 may also be disposed on the pad oxide layer 102. In this embodiment, a barrier layer is further formed on the pad oxide layer 102 when forming the gate oxide layer 108, and then a patterned photoresist layer is formed on the barrier layer. A part of the barrier layer is exposed, and then etching is performed. The barrier layer and the pad oxide layer 102 are sequentially removed so that a recess is formed to expose the substrate 101. Thereafter, the gate oxide layer 108 is formed in the recess, and then the barrier layer is removed. In this embodiment, the barrier layer may be, for example, a silicon nitride layer.

In this embodiment, the semiconductor device may include various memories, such as a non-volatile memory, a programmable read-only memory, an erasable programmable read-only memory, or a flash memory.

In conclusion, the present disclosure discloses a method for manufacturing semiconductor device. By using the barrier layer repeatedly, the method can avoid forming a recess on the shallow trench isolation structure. In addition, the thickness of the gate oxide layer can be adjusted according to the requirement of the semiconductor structure, thereby simplifying the production process and reducing the production costs. The present disclosure further provides a semiconductor device formed by using the manufacturing method. The semiconductor device may be, for example, a non-volatile memory, a programmable read-only memory, an erasable programmable read-only memory, or a flash memory.

Throughout the specification, "one embodiment", "an embodiment" or "a specific embodiment" means that specific features, structures or characteristics described with reference to embodiments are included in at least one embodiment of the present disclosure and not necessarily in all the embodiments. Therefore, the phrase "in one embodiment", "in an embodiment" or "in a specific embodiment" that appears in different places throughout the specification does not necessarily refer to the same embodiment. Moreover, the specific features, structures, or characteristics of any specific embodiment of the present disclosure may be combined with one or more other embodiments in any appropriate manner. It should be understood that other variations and modifications may be made to the embodiments described and shown in the present disclosure according to the teachings of the specification and shall be considered to fall within the spirit and scope of the present disclosure.

It should also be understood that one or more of the elements shown in the drawings may be implemented in a more separate or integrated manner, or even removed because they cannot be operated in some cases, or provided because they can be useful for a particular application.

In addition, unless otherwise specified, any sign arrows in the drawings should be considered exemplary only and not limitative. Moreover, unless otherwise specified, the term "or" used herein is generally intended to mean "and/or". When it is unclear whether the term provides separation or combination capability, the combination of components or operations will also be considered as having been specified.

As described herein and used throughout the claims below, unless otherwise specified, "a", "an" and "the" include plural references. Similarly, as described herein and used throughout the claims below, unless otherwise specified, the meaning of "in" includes "in" and "on".

The above description of the embodiments in the present disclosure (including the content described in the abstract of the specification) is not intended to perform enumeration in detail or limit the present disclosure to the precise form disclosed herein. Although specific embodiments and examples of the present disclosure are described herein for the purpose of description only, as appreciated and understood by a person skilled in the art, various equivalent modifications may be made within the spirit and scope of the present disclosure. As noted, modifications may be made to the present disclosure according to the above description of the embodiments of the present disclosure, and such modifications shall fall within the spirit and scope of the present disclosure.

For the understanding of details of the present disclosure, the system and method have been described in general. In addition, various specific details have been given to provide an overall understanding of the embodiments of the present disclosure. However, a person skilled in the relevant art will realize that the embodiments of the present disclosure may be practiced without one or more specific details or by using other apparatuses, systems, fittings, methods, components, materials, parts, and the like. In other cases, known structures, materials and/or operations are not specifically shown or described in detail to avoid confusion in all aspects of the embodiments of the present disclosure.

Therefore, although the present disclosure has been described herein with reference to its specific embodiments, various modifications, changes, and replacements are intended to fall within the above disclosure. It should be understood that, in some cases, some features of the present disclosure will be adopted in a case that other features are not correspondingly used without departing from the scope and spirit of the present disclosure. Therefore, many modifications may be made to adapt a particular environment or material to the essential scope and spirit of the present disclosure. The present disclosure is not intended to limit specific terms used in the claims below and/or specific embodiments that are disclosed as the best way to perform the present disclosure, but the present disclosure shall include any and all embodiments and equivalents falling within the scope of the appended claims. Therefore, the scope of the present disclosure shall be subject to only the appended claim.

What is claimed is:

1. A method for manufacturing semiconductor device, comprising:
   preparing a substrate;
   forming a pad oxide layer and a barrier layer on the substrate, wherein the barrier layer is disposed on the pad oxide layer;
   forming a plurality of shallow trench isolation structures in the substrate to form multiple regions in the substrate;
   removing a part of the barrier layer to form a recess surrounded by remaining parts of the barrier layer, wherein the recess is set in any one of the multiple regions, and a region directly below the recess is defined as a high voltage device region, wherein the recess exposes the pad oxide layer or the substrate; and
   forming a gate oxide layer in the recess with the recess defining the gate oxide layer, and after the gate oxide layer is formed, removing the remaining parts of the barrier layer, wherein a thickness of the gate oxide layer is greater than a thickness of the pad oxide layer,
   wherein forming the plurality of shallow trench isolation structures comprises:
   forming a plurality of trenches, wherein the trenches run through the pad oxide layer and the barrier layer, and extend to the substrate;
   forming an oxide layer on bottoms and sidewalls of the trenches and on the barrier layer by means of chemical vapor deposition;
   performing chemical mechanical polishing to cause top surfaces of materials deposited in the trenches to be leveled with a top surface of the barrier layer, so as to form the plurality of shallow trench isolation structures.

2. The method according to claim 1, wherein the gate oxide layer is disposed on the high voltage device region.

3. The method according to claim 1, wherein a region adjacent to the high voltage device region in the plurality of regions is defined as a low voltage device region, and the low voltage device region is isolated from the high voltage device region through the shallow trench isolation structure.

4. A semiconductor structure, comprising:
   a substrate;
   a pad oxide layer, disposed on the substrate;
   a plurality of shallow trench isolation structures, formed in the substrate and dividing the substrate into multiple regions;
   a gate oxide layer, disposed on the pad oxide layer, wherein a thickness of the gate oxide layer is greater than a thickness of the pad oxide layer, and the gate oxide layer is formed by:
   forming a barrier layer on the pad oxide layer;
   removing a part of the barrier layer to form a recess surrounded by remaining parts of the barrier layer, wherein the recess is set in any one of the multiple regions, and a region directly below the recess is defined as a high voltage device region, wherein the recess exposes the pad oxide layer or the substrate; and
   forming a gate oxide layer in the recess with the recess defining the gate oxide layer, and after the gate oxide layer is formed, removing the remaining parts of the barrier layer;
   wherein forming the plurality of shallow trench isolation structures comprises:
   forming a plurality of trenches, wherein the trenches run through the pad oxide layer and the barrier layer, and extend to the substrate;

forming an oxide layer on bottoms and sidewalls of the trenches and on the barrier layer by means of chemical vapor deposition; and performing chemical mechanical polishing to cause top surfaces of materials deposited in the trenches to be leveled with a top surface of the barrier layer, so as to form the plurality of shallow trench isolation structures.

5. The semiconductor structure according to claim 4, wherein the semiconductor structure comprises a memory.

* * * * *